United States Patent
Jang et al.

(10) Patent No.: US 6,171,896 B1
(45) Date of Patent: Jan. 9, 2001

(54) METHOD OF FORMING SHALLOW TRENCH ISOLATION BY HDPCVD OXIDE

(75) Inventors: Syun-Ming Jang; Chen-Hua Yu, both of Hsin-Chu; Ying-Ho Chen, Taipei, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 08/794,597

(22) Filed: Feb. 3, 1997

(51) Int. Cl.⁷ .................. H01L 21/8238; H01L 21/76; H01L 21/336

(52) U.S. Cl. ............... 438/221; 438/424; 438/427; 438/296

(58) Field of Search .................. 437/67; 438/424, 438/427, 296, 221

(56) References Cited

U.S. PATENT DOCUMENTS

| | | | |
|---|---|---|---|
| 4,916,087 | * 4/1990 | Tateoka et al. | 437/67 |
| 5,275,965 | 1/1994 | Manning | 437/67 |
| 5,459,096 | * 10/1995 | Venkatesan et al. | 437/67 |
| 5,492,858 | * 2/1996 | Bose et al. | 437/67 |
| 5,494,854 | * 2/1996 | Jain | 437/195 |
| 5,494,857 | 2/1996 | Cooperman et al. | 437/228 |
| 5,498,565 | * 3/1996 | Gocho et al. | 437/67 |
| 5,518,950 | 5/1996 | Ibok et al. | 437/67 |
| 5,531,834 | * 7/1996 | Ishizuka et al. | 118/723 E |
| 5,578,519 | * 11/1996 | Cho | 437/67 |
| 5,686,356 | * 11/1997 | Jain et al. | 437/195 |
| 5,783,488 | * 7/1998 | Bothra et al. | 438/692 |

* cited by examiner

Primary Examiner—Wael Fahmy
Assistant Examiner—Brook Kebede
(74) Attorney, Agent, or Firm—George O. Saile; Stephen B. Ackerman; Rosemary L. S. Pike

(57) ABSTRACT

A method for forming planarized shallow trench isolation is described. A pad oxide layer is grown over the surface of a semiconductor substrate. A nitride layer is deposited overlying the pad oxide layer. A plurality of isolation trenches are etched through the nitride and pad oxide layers into the semiconductor substrate wherein there are at least one first wide nitride region between two of the trenches and at least one second narrow nitride region between another two of the trenches. A high density plasma oxide layer is deposited over the nitride layer and within the isolation trenches wherein the high density plasma oxide layer fills the isolation trenches and wherein the high density plasma oxide deposits more thickly in the first region over the wide nitride layer and deposits more thinly in the second region over the narrow nitride layer. A photoresist mask is formed over the high density plasma oxide layer. The substrate is exposed to actinic light wherein a central portion of the first region is exposed. The high density plasma oxide layer is etched away where it has been exposed. The high density plasma oxide layer remaining is polished away whereby the substrate is planarized and fabrication of said integrated circuit device is completed.

17 Claims, 4 Drawing Sheets

US 6,171,896 B1

METHOD OF FORMING SHALLOW TRENCH ISOLATION BY HDPCVD OXIDE

BACKGROUND OF THE INVENTION (1) Field of the Invention

The present invention relates to the fabrication of integrated circuit devices, and more particularly, to a method of forming planarized shallow trench isolation in the fabrication of integrated circuits.

(2) Description of the Prior Art

Shallow trench isolation (STI) is gaining substantial interest for deep sub-micron processes. To achieve good planarity after STI, chemical mechanical polishing (CMP) is a more promising solution than is etchback. However, due to pad deformation, the trench open area is susceptible to dishing which causes oxide thinning in the wide trench. In addition, the pattern dependency of CMP leads to non-uniform oxide removal on the silicon nitride underlayer of different dimensions. In order to remove all the oxide on the silicon nitride before nitride stripping, overpolishing is generally carried out at the cost of severe oxide dishing and silicon nitride erosion.

FIG. 1 illustrates a partially completed integrated circuit device of the prior art. A pad oxide layer 12 and a silicon nitride layer 14 have been deposited over the surface of a semiconductor substrate 10. Trenches in the substrate have been filled with an oxide 17 which has been polished using CMP. Oxide dishing and silicon nitride erosion can both be seen in area 19.

In order to reduce these problems, the use of a reverse tone mask at the device pattern layer has been proposed. But, due to the great difficulties in overlaying the device pattern mask and reverse-tone device pattern mask on a non-planarized oxide surface, this approach becomes very challenging for deep sub-micron processes.

U.S. Pat. No. 5,275,965 to Manning shows a method of forming trench isolation using gated sidewalls. U.S. Pat. No. 5,494,857 to Cooperman et al teaches CMP shallow trenches using a reverse-tone mask and a silicon nitride polish stop layer. U.S. Pat. No. 5,518,950 to Ibok et al shows a method in which spin-on-glass in trenches is covered with a resist mask to increase the spin-on-glass thickness over the trenches.

SUMMARY OF THE INVENTION

Accordingly, the primary object of the invention is to provide a process for forming planarized shallow trench isolation in the fabrication of integrated circuits.

A further object of the invention is to provide a process for forming planarized shallow trench isolation in which oxide dishing is eliminated.

Still another object is to provide a process for forming planarized shallow trench isolation in which silicon nitride erosion is reduced.

Yet another object of the invention is to provide a process for forming planarized shallow trench isolation in which CMP uniformity is improved.

In accordance with the objects of the invention, a method for forming planarized shallow trench isolation is achieved. A pad oxide layer is grown over the surface of a semiconductor substrate. A nitride layer is deposited overlying the pad oxide layer. A plurality of isolation trenches are etched through the nitride and pad oxide layers into the semiconductor substrate wherein there are at least one first wide nitride region between two of the trenches and at least one second narrow nitride region between another two of the trenches. A high density plasma oxide layer is deposited over the nitride layer and within the isolation trenches wherein the high density plasma oxide layer fills the isolation trenches and wherein the high density plasma oxide deposits more thickly in the first region over the wide nitride layer and deposits more thinly in the second region over the narrow nitride layer. A photoresist mask is formed over the high density plasma oxide layer. The substrate is exposed to actinic light wherein a central portion of the first region is exposed. The high density plasma oxide layer is etched away where it has been exposed. The high density plasma oxide layer remaining is polished away whereby the substrate is planarized and fabrication of said integrated circuit device is completed.

BRIEF DESCRIPTION OF THE DRAWINGS

In the accompanying drawings forming a material part of this description, there is shown.

DESCRIPTION OF THE PREFERRED EMBODIMENTS

Figure 1:
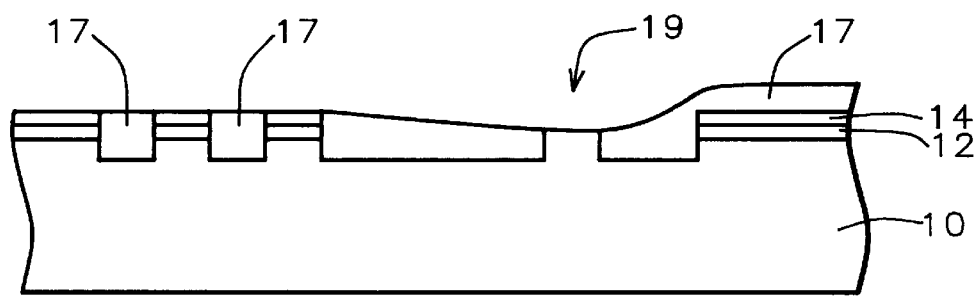
FIG. 1 is a cross-sectional representation of an embodiment of the prior art.
Figure 2:
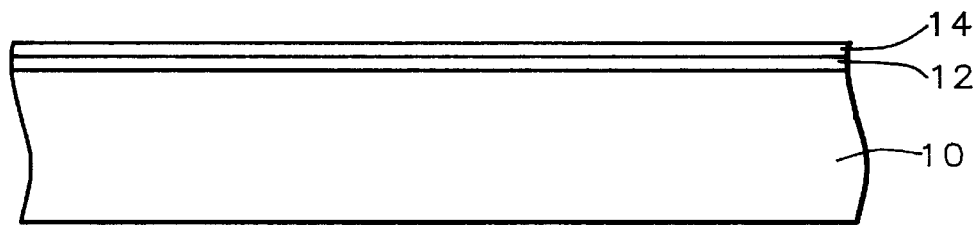
FIGS. 2 through 7 are cross-sectional representations of a preferred embodiment of the present invention.

Referring now more particularly to FIG. 2, there is shown a semiconductor substrate 10. A layer of pad silicon oxide 12 is grown on the surface of the semiconductor substrate to a thickness of between about 100 and 150 Angstroms. A layer of silicon nitride 14 is deposited over the pad oxide layer 12 to a thickness of between about 1500 and 2000 Angstroms.

Figure 3:
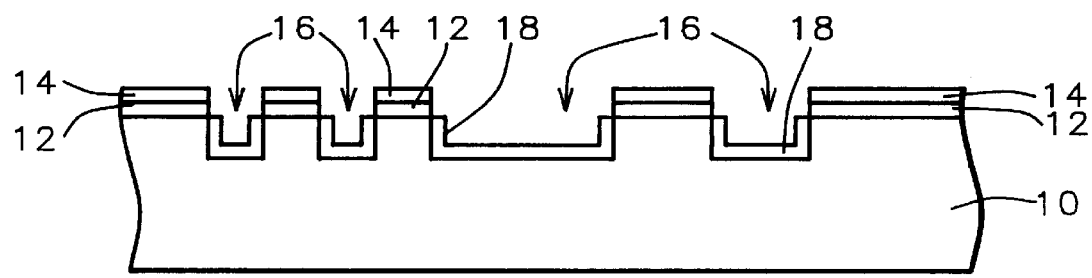

Referring now to FIG. 3, shallow trenches are etched into the silicon substrate using conventional photolithography and etching techniques. The shallow trenches 16 are etched to a depth of between about 3000 and 5000 Angstroms into the semiconductor substrate.

A lining oxide layer 18 is grown on the exposed silicon surface on the bottom and sidewalls of the trenches to a thickness of between about 300 and 400 Angstroms. The lining oxide ensures a good-quality sidewall between the silicon substrate and the trench oxide.

Figure 4:
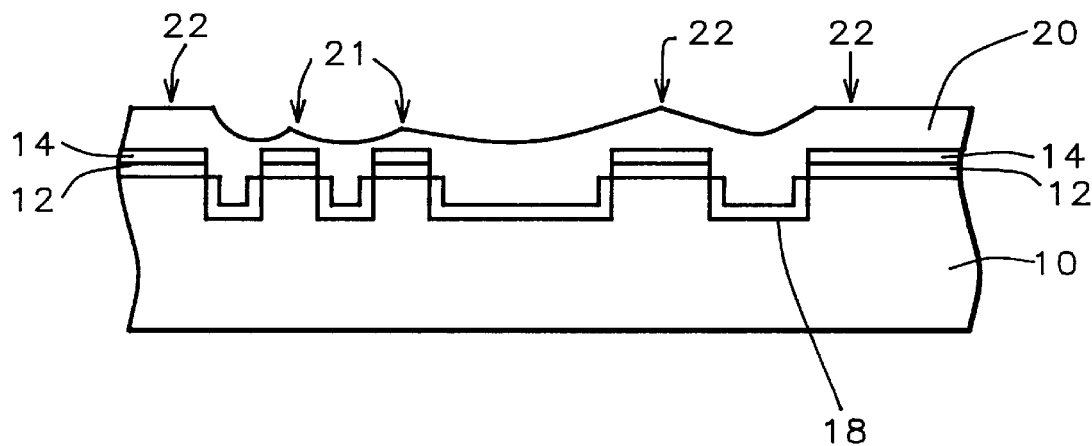

Next, as illustrated in FIG. 4, a layer of high density plasma oxide 20 is deposited by chemical vapor deposition (HDPCVD) to a thickness of about 7000 Angstroms over the surface of the substrate and filling the trenches. The HDPCVD oxide is deposited by flowing silane, oxygen, and argon gases.

Because of the characteristics of the HDPCVD deposition, the oxide overlying the narrow silicon nitride areas 21 is thin while the oxide overlying the wide silicon nitride areas 22 is thick. For example, for a silicon nitride width of about 0.3 micron, the HDPCVD oxide would have a thickness of about 0.15 micron. A silicon nitride width of about 1.0 micron would have a HDPCVD oxide thickness of about 0.55 micron. This thickness difference causes problems. In the thinner areas 21, silicon nitride erosion and silicon polishing may occur which would damage the device areas. In the thicker areas 22, some of the oxide may remain making the nitride stripping difficult.

Figure 5:
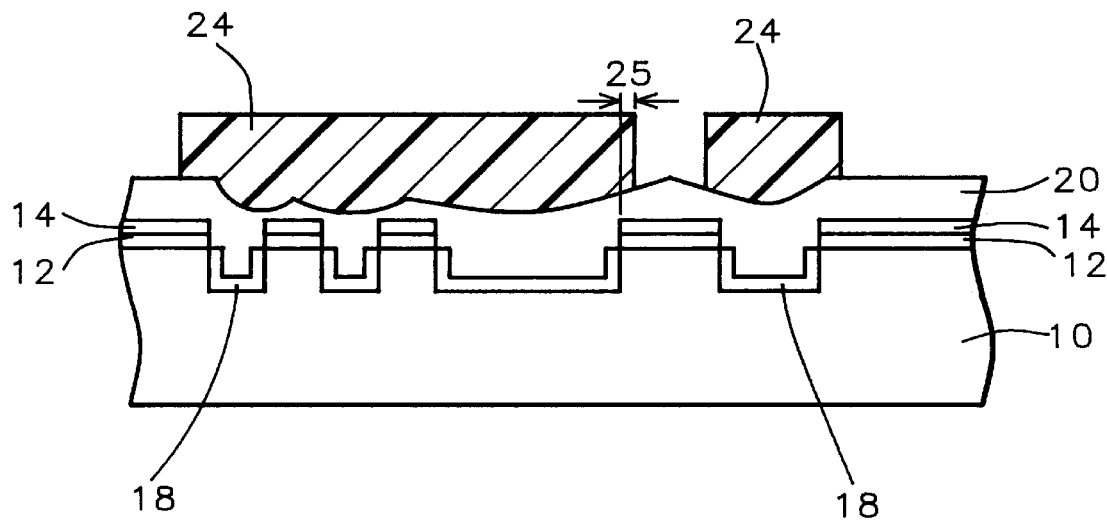

The process of the invention resolves these problems with HDPCVD oxide. Referring to FIG. 5, the HDPCVD oxide 20 is patterned by exposing the wide silicon nitride areas on which the oxide 20 is thick; that is, those areas wider than 1 micron. A bias 25 is imposed so that the exposure area is smaller than the dimension of the silicon nitride. Since the exposed area is large, the bias is not critical. For example, for a 1 micron wide silicon nitride area, a 0.8 micron window might be used.

Figure 6:
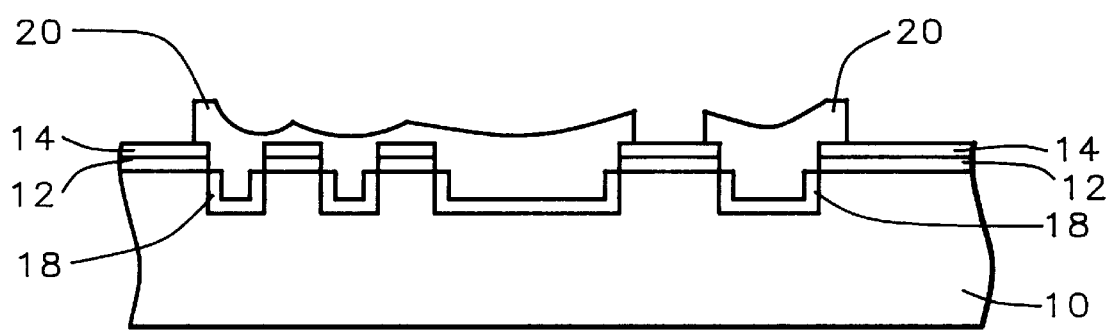

The photoresist mask 24 is shown in FIG. 5. The HDPCVD oxide 20 that is exposed is etched away to the silicon nitride layer 14 using either a wet or a dry etch, as illustrated in FIG. 6. The thickest HDPCVD oxide has now been removed. The photoresist mask is stripped.

Figure 7:
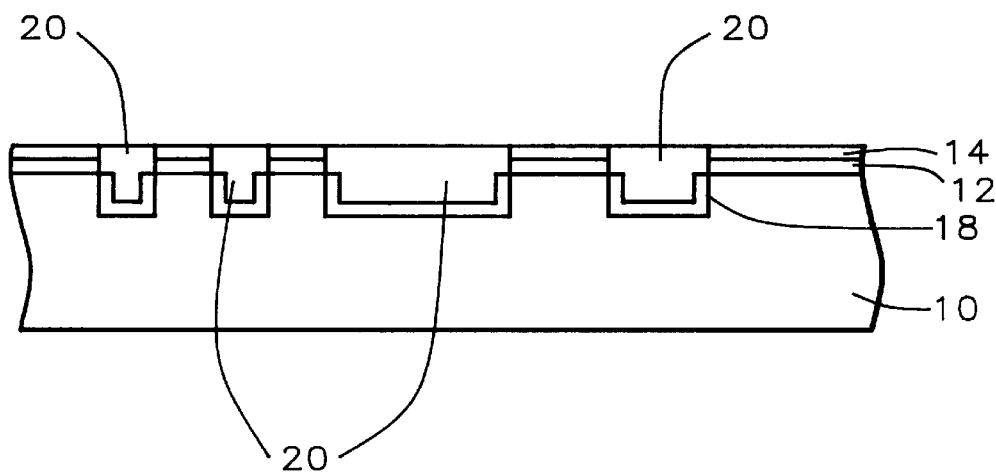

Referring now to FIG. 7, the residual oxide 20 on the narrow silicon nitride areas is polished, stopping at the silicon nitride layer. The amount of residual oxide to be polished is greatly reduced; therefore, chemical mechanical polishing (CMP) throughput and uniformity are improved significantly. The short polish time and the good uniformity also prevent silicon nitride erosion. Also, dishing over the wide trench is eliminated since the trench oxide becomes extruded before polishing. Oxide remaining on the silicon nitride is eliminated since the thick oxide over the wide silicon nitride areas is etched away before polishing. Through the process of the present invention, the oxide thickness can be reduced to only about 1000 to 2000 Angstroms above the trench. The CMP process can easily polish away that thickness of oxide above the trenches.

Figure 8:
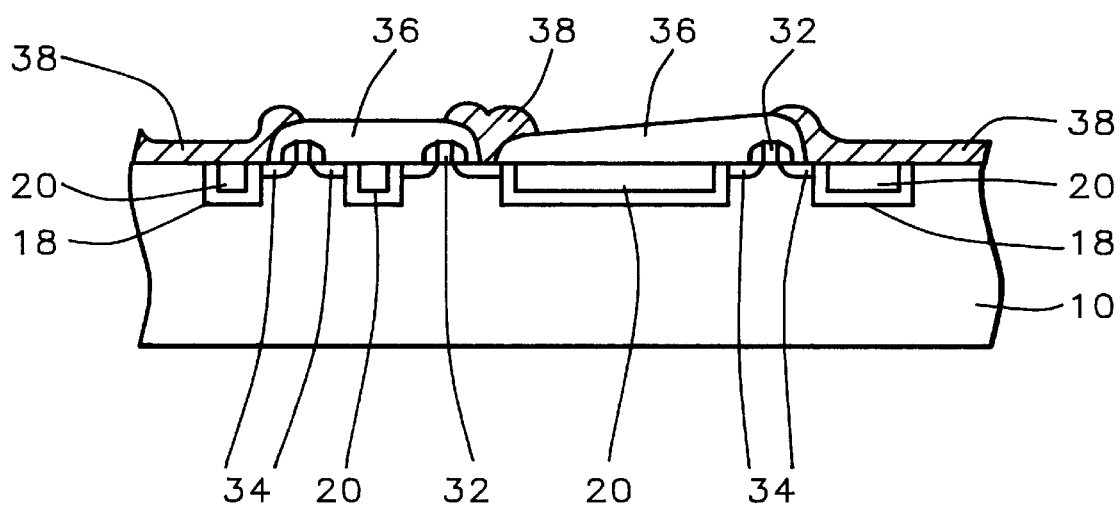
FIG. 8 is a cross-sectional representation of a completed integrated circuit device fabricated by the process of the present invention.

The silicon nitride is etched away and the pad oxide is removed completing the formation of the shallow trench isolation. Semiconductor device structures, including gate electrodes 32 and source and drain regions 34 may be formed as is conventional in the art. Electrical contacts 38 may be made through dielectric isolation layer 36, as shown in FIG. 8.

The process of the present invention results in the formation of planarized shallow trench isolation using HDPCVD oxide wherein oxide dishing is eliminated, silicon nitride erosion is reduced, CMP uniformity is improved, and CVD and CMP throughputs are improved.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit device comprising:

providing a pad oxide layer over the surface of a semiconductor substrate;

depositing a nitride layer overlying said pad oxide layer;

etching a plurality of isolation trenches through said nitride layer and pad oxide layer into said semiconductor substrate wherein there is at least one first region having a wide nitride area between two of said isolation trenches and at least one second region having a narrow nitride area between another two of said isolation trenches;

depositing a high density plasma oxide layer over said nitride layer and within said isolation trenches wherein said high density plasma oxide layer fills said isolation trenches and wherein said high density plasma oxide layer has a first thickness in said first region over said wide nitride area and a second thickness in said second region over said narrow nitride area wherein said first thickness is larger than said second thickness;

forming a photoresist mask over said high density plasma oxide layer and exposing said substrate to actinic light wherein a central portion of said first region is exposed;

etching away said high density plasma oxide layer within said central portion of said first region wherein said central portion is about 80% of the width of said first region thereby leaving only said second thickness of said high density plasma oxide layer to be planarized;

polishing away said high density plasma oxide layer remaining wherein said substrate is planarized; and completing the fabrication of said integrated circuit device.

2. The method according to claim 1 further comprising growing a lining oxide layer on the bottom and sidewall surfaces of said isolation trenches before said step of depositing of said high density plasma oxide layer.

3. The method according to claim 1 wherein said high density plasma oxide layer is deposited to a thickness of about 7000 Angstroms.

4. The method according to claim 1 wherein said step of etching away said high density plasma oxide layer within said central portion of said first region allows for said step of polishing to be uniform.

5. The method according to claim 1 wherein said step of polishing is done by chemical mechanical polishing.

6. The method according to claim 1 wherein said step of completing fabrication of said integrated circuit device comprises:

etching away said silicon nitride layer;

removing said pad oxide layer; and fabricating semiconductor device structures in and on said semiconductor substrate between said isolation trenches.

7. A method of manufacturing an integrated circuit device comprising:

providing a pad oxide layer over the surface of a semiconductor substrate;

depositing a nitride layer overlying said pad oxide layer;

etching a plurality of isolation trenches through said nitride layer and pad oxide layer into said semiconductor substrate wherein there is at least one first region having a wide nitride area between two of said isolation trenches and at least one second region having a narrow nitride area between another two of said isolation trenches;

depositing a high density plasma oxide layer over said nitride layer and within said isolation trenches wherein said high density plasma oxide layer fills said isolation trenches and wherein said high density plasma oxide layer has a first thickness in said first region over said wide nitride area and a second thickness in said second region over said narrow nitride area wherein said first thickness is larger than said second thickness;

forming a photoresist mask over said high density plasma oxide layer and exposing said substrate to actinic light wherein a central portion of said first region is exposed;

etching away said high density plasma oxide layer within said central portion of said first region wherein said central portion is about 80% of the width of said first region;

polishing away said high density plasma oxide layer remaining wherein said substrate is planarized;

thereafter etching away said silicon nitride layer and removing said pad oxide layer;

fabricating semiconductor device structures in and on said semiconductor substrate between said isolation trenches; and completing the fabrication of said integrated circuit device.

8. The method according to claim 7 further comprising growing a lining oxide layer on the bottom and sidewall surfaces of said isolation trenches before said step of depositing of said high density plasma oxide layer.

9. The method according to claim 7 wherein said high density plasma oxide layer is deposited to a thickness of about 7000 Angstroms.

10. The method according to claim 7 wherein said step of etching away said high density plasma oxide layer within said central portion of said first region allows for said step of polishing to be uniform.

11. The method according to claim 7 wherein said step of polishing is done by chemical mechanical polishing.

12. The method according to claim 7 wherein said semiconductor device structures comprise gate electrodes and source and drain regions and electrical connections between said device structures.

13. A method of forming shallow trench isolation in the fabrication of an integrated circuit device comprising:

providing a pad oxide layer over the surface of a semiconductor substrate;

depositing a nitride layer overlying said pad oxide layer;

etching a plurality of isolation trenches through said nitride layer and pad oxide layer into said semiconductor substrate wherein there is at least one first region having a wide nitride area between two of said isolation trenches and at least one second region having a narrow nitride area between another two of said isolation trenches;

depositing a high density plasma oxide layer over said nitride layer and within said isolation trenches wherein said high density plasma oxide layer fills said isolation trenches and wherein said high density plasma oxide layer has a first thickness in said first region over said wide nitride area and a second thickness in said second region over said narrow nitride area wherein said first thickness is larger than said second thickness;

forming a photoresist mask over said high density plasma oxide layer and exposing said substrate to actinic light wherein a central portion of said first region is exposed;

etching away said high density plasma oxide layer within said central portion of said first region wherein said central portion is about 80% of the width of said first region;

polishing away said high density plasma oxide layer remaining wherein said substrate is planarized;

etching away said silicon nitride layer; and removing said pad oxide layer to complete the formation of said shallow trench isolation in the fabrication of said integrated circuit device.

14. The method according to claim 13 further comprising growing a lining oxide layer on the bottom and sidewall surfaces of said isolation trenches before said step of depositing of said high density plasma oxide layer.

15. The method according to claim 13 wherein said high density plasma oxide layer is deposited to a thickness of about 7000 Angstroms.

16. The method according to claim 13 wherein said step of etching away said high density plasma oxide layer within said central portion of said first region allows for said step of polishing to be uniform.

17. The method according to claim 13 wherein said step of polishing is done by chemical mechanical polishing.

* * * * *